US012757751B2

(12) United States Patent
Böttcher et al.

(10) Patent No.: US 12,757,751 B2

(45) Date of Patent: Oct. 6, 2026

(54) SEMICONDUCTOR PACKAGE ASSEMBLY WITH ELECTRIC FIELD MODULATION STRUCTURES

(71) Applicant: NEXPERIA B.V., Nijmegen (NL)

(72) Inventors: Tim Böttcher, Hamburg (DE); Hans-Juergen Funke, Hamburg (DE); Ivan Shiu, Hamburg (DE)

(73) Assignee: Nexperia B.V., Nijmegen (NL)

( * ) Notice: Subject to any disclaimer, the term of this patent is extended or adjusted under 35 U.S.C. 154(b) by 413 days.

(21) Appl. No.: 18/481,292

(22) Filed: Oct. 5, 2023

(65) Prior Publication Data

US 2024/0120260 A1 Apr. 11, 2024

(30) Foreign Application Priority Data

Oct. 5, 2022 (EP) .................................... 22199871

(51) Int. Cl.

*H10W 70/40* (2026.01)
*H10W 74/10* (2026.01)
*H10W 90/00* (2026.01)
*H10W 74/00* (2026.01)

(52) U.S. Cl.

CPC ........ *H10W 70/421* (2026.01); *H10W 70/411* (2026.01); *H10W 70/465* (2026.01); *H10W 74/111* (2026.01); *H10W 90/811* (2026.01); *H10W 74/00* (2026.01); *H10W 90/756* (2026.01)

(58) Field of Classification Search

CPC ............. H10W 70/421; H10W 70/465; H10W 90/811; H10W 70/411; H10W 74/111; H01L 23/49541; H01L 23/3107; H01L 23/49503; H01L 23/4952; H01L 23/49575; H01L 24/48; H01L 2224/48247; H01L 2924/1811

USPC .......................................................... 257/666

See application file for complete search history.

(56) References Cited

U.S. PATENT DOCUMENTS

| | | | | |
|---|---|---|---|---|
| 11,222,790 B2 * | 1/2022 | Gan | H01L 23/49503 |
| 2011/0042793 A1 * | 2/2011 | Wong | H01L 23/49537 257/676 |
| 2016/0354868 A1 * | 12/2016 | Matsugi | B23K 35/264 |
| 2020/0303319 A1 * | 9/2020 | Khanolkar | H01L 23/49575 |
| 2020/0328140 A1 * | 10/2020 | Tey | H01L 23/49562 |

* cited by examiner

*Primary Examiner* — Jami Valentine Miller

(74) *Attorney, Agent, or Firm* — Ruggiero McAllister & McMahon LLC

(57) ABSTRACT

A semiconductor package assembly and molding resin case is provided. The package includes a lead frame having a first and a second lead frame side opposite to the first; a semiconductor die structure having a first and a second die side opposite to the first, the die structure being mounted with its second die side on the first lead frame side, resulting in a first connection; a bond element connected to the first die of the die structure, resulting in another connection; with the molding resin case encapsulating at least the die structure, the lead frame and a first part of at least one bond element connected to the die structure, leaving the second lead frame side and the at least one bond element partly exposed; and at least one bond element is provided with electric field modulation structures configured to alter an electric field created between the connections.

15 Claims, 10 Drawing Sheets

SEMICONDUCTOR PACKAGE ASSEMBLY WITH ELECTRIC FIELD MODULATION STRUCTURES

CROSS-REFERENCE TO RELATED APPLICATIONS

This application claims the benefit under 35 U.S.C. § 119(a) of European Application No. 22199871.9 filed Oct. 5, 2022, the contents of which are incorporated by reference herein in their entirety.

BACKGROUND

1. Field of the Disclosure

The present disclosure relates to a semiconductor package assembly consisting of a semiconductor package and a molding resin case.

2. Description of the Related Art

One critical property of semiconductor package assemblies for high voltage devices (>500V) is the creepage and clearance distance of the metal parts within the package assembly. In high voltage applications the minimum creepage distance of electrical conductors is described, e.g. in IEC60664-1 and IPC2221A. The requirement for the minimum distances according to these standards is in contradiction to the trend for higher density electronics which require smaller package assemblies.

US 2016/354868 A1 discloses a solder material that has a high melting point and exhibits superior mechanical characteristics, and therefore can form a connecting portion with high heat-resistant reliability.

Accordingly, it is a goal of the present disclosure to provide an improved semiconductor package assembly capable of suppressing failures in case the distances as defined in the standard are violated e.g. due to limitations in package size.

SUMMARY

According to a first example of the disclosure, a semiconductor package assembly accordingly to the preamble of claim 1 is proposed and further outlined in the characterizing part of claim 1. It consists of a semiconductor package and a molding resin case, the semiconductor package at least comprising a lead frame having a first lead frame side and a second lead frame side opposite to the first lead frame side; a semiconductor die structure having a first die side and a second die side opposite to the first die side, the semiconductor die structure being mounted with its second die side on the first lead frame side of the lead frame, resulting in a first conductive connection; at least one bond element being connected to the first die side of the semiconductor die structure, resulting in at least one further conductive connection; with the molding resin case encapsulating at least the semiconductor die structure, the lead frame and a first element part of the at least one bond element connected to the semiconductor die structure, leaving at least the second lead frame side and the other element part of the at least one bond element partly exposed, wherein the at least one bond element is provided with electric field modulation structures structured to, during operation of the semiconductor package assembly, alter an electric field created between the first conductive connection and the at least further conductive connection.

The implementation of electric field modulation structures within the encapsulation or molding resin case inside the semiconductor package body affect the electric field established between the first conductive connection and the further conductive connection and in particular causes the electric surface field lines of the electric field to be limited or reduced. The electric field modulation structures are mounted within the molding resin case, such that no parts are exposed at the semiconductor package surface. Accordingly high electric fields are limited only to areas with proper insulation and accordingly the semiconductor package is free of contacts with opposite polarity. Accordingly, in an example, the electric field modulation structures are structured to limit or reduce the electric field outside the molding resin case and preferably the electric field modulation structures are encapsulated by the molding resin case.

In a preferred example, the electric field modulation structures are manufactured from a metal and in particular are formed as a shielding plate mounted to the first element part of the at least one bond element within the molding resin case.

The electric field shielding functionality is further improved as in another example, the shielding plate extends from the first element part of the at least one bond element towards the lead frame.

An improved shielding can be further achieved in an example, wherein the shielding plate extends under an angle from the first element part of the at least one bond element towards the lead frame and towards the exposed bond element part or towards the semiconductor die structure. In a particular application, the angle is between 45°-90°.

In a further example the free end of the shielding plate is bend in a direction towards the semiconductor die structure. All configurations of the shielding plate disclosed in this application, pushes the voltage potential present at the at least one bond element towards the edge of the semiconductor package body and prevent reliability failures due to arcing (clearance distance) or tracking (creepage distance). The free bend end of the shielding plate further alters the electric field lines between the first and the further conductive connection of the semiconductor package assembly thus providing a further prevention.

In a further example, the free bend end of the shielding plate can be provided with a bond clip or a bond wire connected with the first die side of the semiconductor die structure, thus establishing the first conductive connection within the encapsulated molding resin case.

In an additional, advantageous example, the at least one bond element itself established the first conductive connection within the encapsulated molding resin case with the semiconductor die structure as in this example the bond element may be composed as a bond clip mounted to the first die side of the semiconductor die structure.

The first conductive connection within the encapsulated molding resin case can be established in an alternative fashion, as the first part of the at least one bond element can be provided with a bond clip or a bond wire, which is connected with the first die side of the semiconductor die structure.

BRIEF DESCRIPTION OF DRAWINGS

The disclosure will now be discussed with reference to the drawings, which show in.

DETAILED DESCRIPTION

Figure 1A:
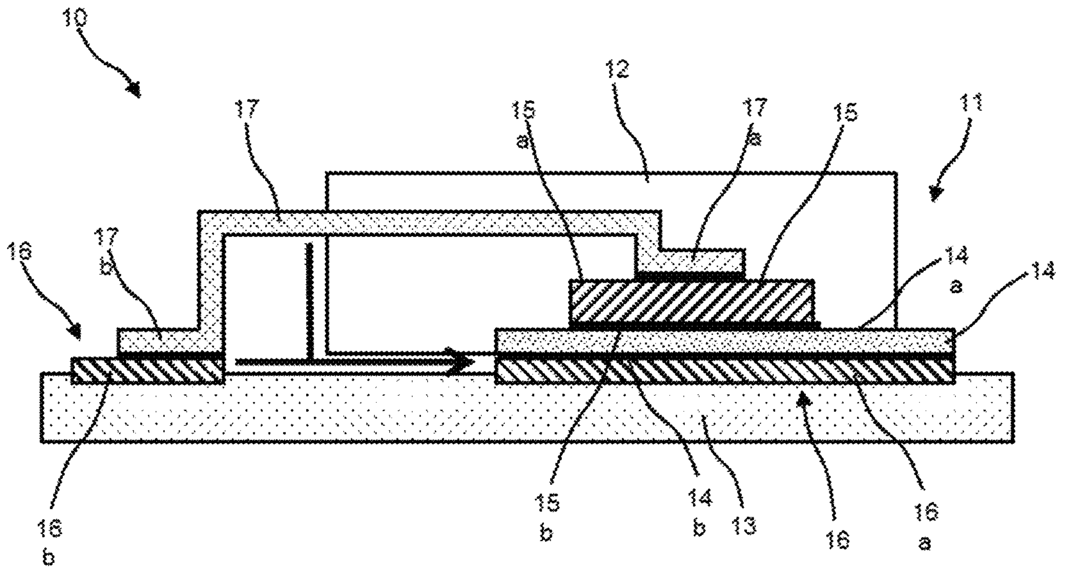
FIGS. 1*a* and 1*b* a semiconductor package assembly according to the state of the art.

For a proper understanding of the disclosure, in the detailed description below corresponding elements or parts of the disclosure will be denoted with identical reference numerals in the drawings.

Figure 1B:
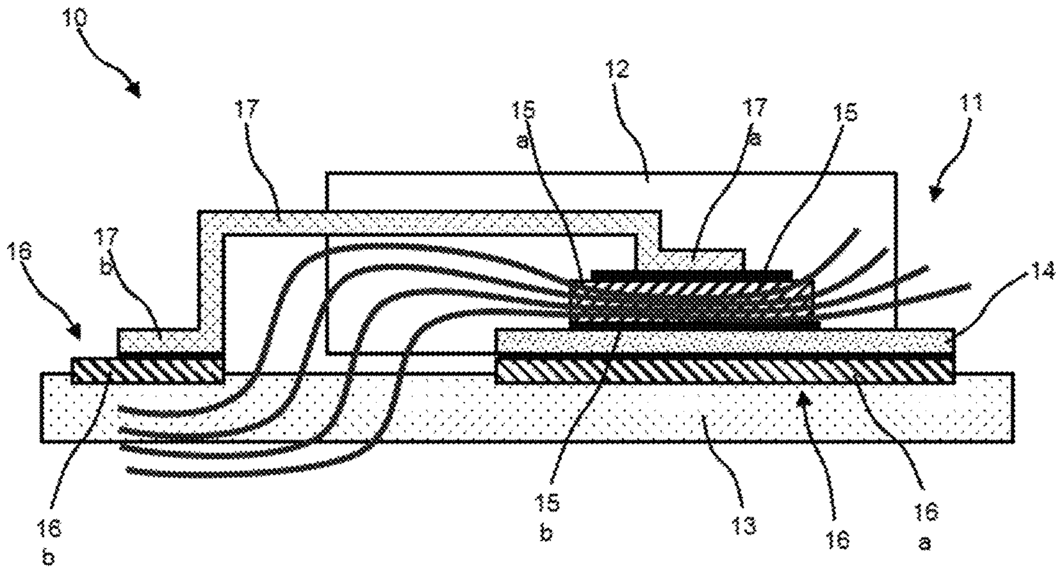

As outlined in the introduction, one critical property of semiconductor package assemblies for high voltage devices (>500V) is the creepage and clearance distance of the metal parts within the package assembly. The requirement for the minimum distances according to these standards is in contradiction to the trend for higher density electronics which require smaller package assemblies. The adverse effects of high voltages applied in a semiconductor package assembly according to the state of the art is depicted in FIGS. 1*a* and 1*b*. The semiconductor package assembly according to the state of the art is denoted with reference numeral 10 and consists of a semiconductor package 11 and a molding resin case 12.

The semiconductor package 11 is composed of a lead frame 14 having a first lead frame side 14*a* and a second lead frame side 14*b* opposite to the first lead frame side 14*a*. A semiconductor die structure 15 has a first die side 15*a* and a second die side 15*b* opposite to the first die side 15*a* and is mounted with its second die side 15*b* on the first lead frame side 14*a* of the lead frame 14. In addition, at least one bond element 17 is provided which is connected with its first element part 17*a* to the first die side 15*a* of the semiconductor die structure 15.

As shown in FIGS. 1*a* and 1*b*, the molding resin case 12 encapsulates at least the semiconductor die structure 15, the lead frame 14 and a first part of the bond element 17 (at least comprising the first element part 17*a*) and leaves the other part of the bond element 17 at least comprising the other element part 17*b* partly exposed. Moreover, the second lead frame side 14*b* of the lead frame 14 is also not encapsulated by the molding resin case 12, but is exposed similar as the other element part 17*b* of the bond element 17. The encapsulated semiconductor die structure 15, the lead frame 14 and the bond element 17 (both its encapsulated element part 17*a* and exposed other element part 17*b*) are considered a semiconductor package assembly 10.

Such semiconductor package assembly 10 can be used in all kinds of electronics applications. To this end the semiconductor package assembly 10 can be mounted to a Printed Circuit Board, PCB, denoted with reference numeral 13.

The PCB 13 is provided with several PCB solder pads 16. In particular, reference numeral 16*a* denotes a PCB solder pad for the heat sink of the semiconductor package assembly 10 which heat sink is formed by the exposed second lead frame side 14*b* of the lead frame 14. Likewise, reference numeral 16*b* denotes a PCB solder pad for electrically connecting the exposed, other element part 17*b* of the bond element 17 with the PCB 13.

As shown in FIG. 1*b*, during operation of the semiconductor package assembly 10 according to the state of the art, an electric field is established between the PCB solder pad 16*b* and the semiconductor die structure 15. The electrostatic potentials generated by this electric field may cause reliability failures due to arcing (clearance distance) or tracking (creepage distance).

Several solutions for the above problem are presented in several examples $\mathbf{10}_1$-$\mathbf{10}_2$-$\mathbf{10}_3$-$\mathbf{10}_4$ of the present disclosure in FIGS. 2*a*-2*b*, 3*a*-3*c* and 4*a*-4*b* and 5.

In these examples, reference numeral 17*z* denotes electric field modulation structures, which are structured to, during operation of the semiconductor package assembly $\mathbf{10}_1$-$\mathbf{10}_2$-$\mathbf{10}_3$-$\mathbf{10}_4$, alter an electric field created between the PCB solder pad 16*a* and the semiconductor die structure 15. The electric field modulation structures 17*z* are provided with or are mounted to or are an integral part of the at least one bond element 17.

In particular, the electric field modulation structures 17*z* causes the electric surface field lines of the electric field E established between the solder pad 16*a* and the semiconductor die structure 15 to be limited or reduced. The electric field modulation structures 17*z* are mounted or encapsulated within the molding resin case 12, and accordingly no parts of the electric field modulation structures 17*z* are exposed at the surface of the semiconductor package 11. Accordingly high electric fields are limited only to areas with proper insulation and the semiconductor package 11 is free of contacts with opposite polarity. In an example, the electric field modulation structures 17*z* are structured to limit or reduce the electric field E outside the molding resin case 12.

It is preferred to have the electric field modulation structures 17*z* to be manufactured from a metal.

In all examples of FIGS. 2*a*-2*b*, 3*a*-3*c*, 4*a*-4*b* and 5, are the electric field modulation structures are formed as a shielding plate 17*z*. The shielding plate 17*z* is mounted to the first part of the bond element 17, which first part is encapsulated within the molding resin case 12. Accordingly, the shielding plate 17*z* is also completely encapsulated by the molding resin case 12 and no parts thereof are exposed at the surface of the semiconductor package 11.

Figure 2A:
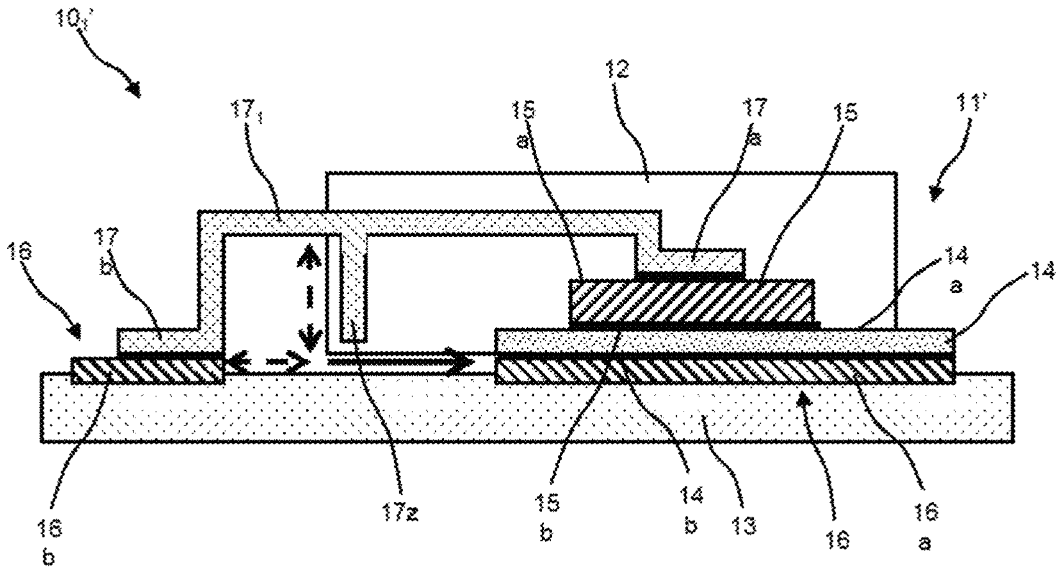
FIGS. 2*a* and 2*b* are a first example of a semiconductor package assembly according to the disclosure.
Figure 2B:
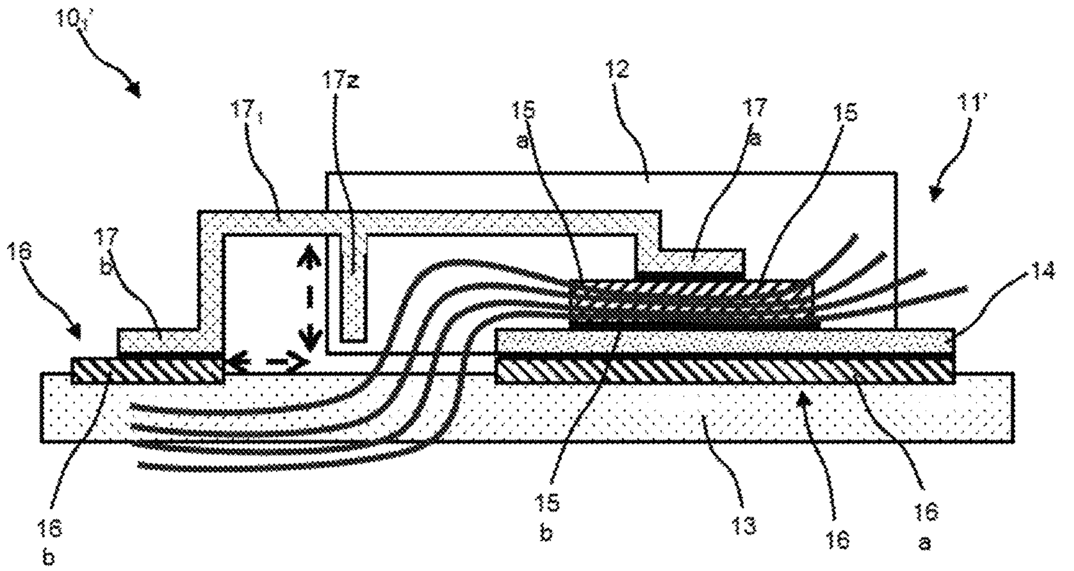

As shown in the example $\mathbf{10}_1$ of a semiconductor package assembly according to the disclosure of FIGS. 2*a* and 2*b*, the shielding plate 17*z* extends from the first part of the bond element 17 towards the lead frame 14 and the PCB 13, and provides an effective diversion of the electric field as established. In particular, the shielding plate 17*z* effectively prevents or limits any electric field between the shielding plate 17*z* and the exposed element part 17*b* of the bond element 17 and the semiconductor die structure 15, see FIG. 2*b*.

Figure 3A:
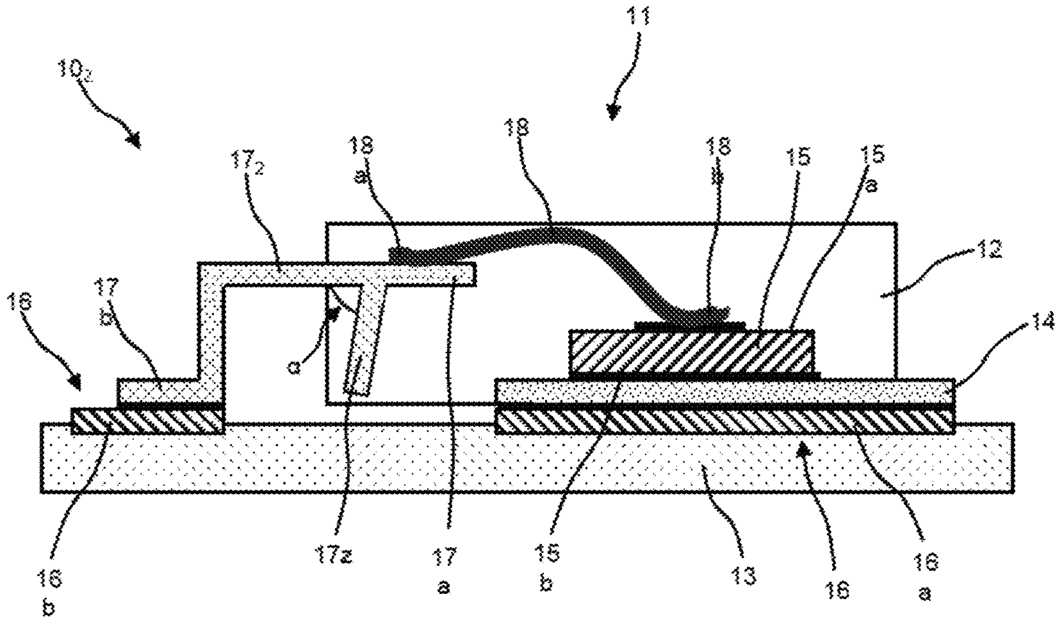
FIGS. 3*a*, 3*b* and 3*c* a second-third-fourth examples of a semiconductor package assembly according to the disclosure.
Figure 3B:
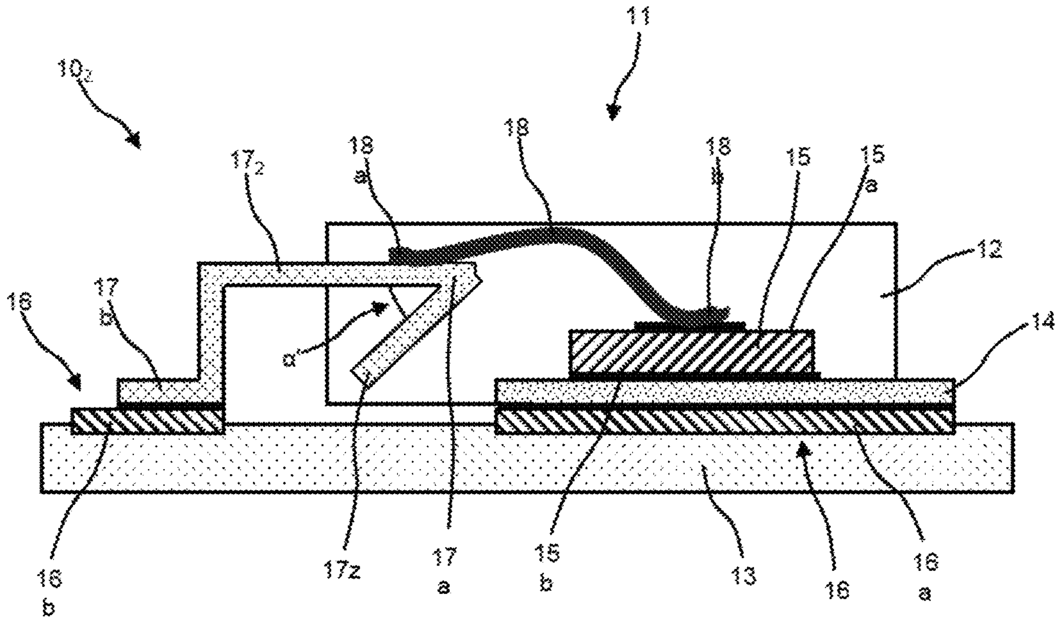

FIGS. 3*a* and 3*b* show the semiconductor package assembly $\mathbf{10}_2$ with further improved shielding functionalities with the shielding plate 17*z* extending under an angle α from the first, encapsulated element part 17*a* of the bond element $\mathbf{17}_2$ in a direction towards the exposed element part 17*b* of the bond element $\mathbf{17}_2$ and the solder pad 16*b*. In a particular application, the angle α is between 45°-90°, with FIG. 3*b* showing a more acute angle α compared to the example of FIG. 3*a*.

Figure 3C:
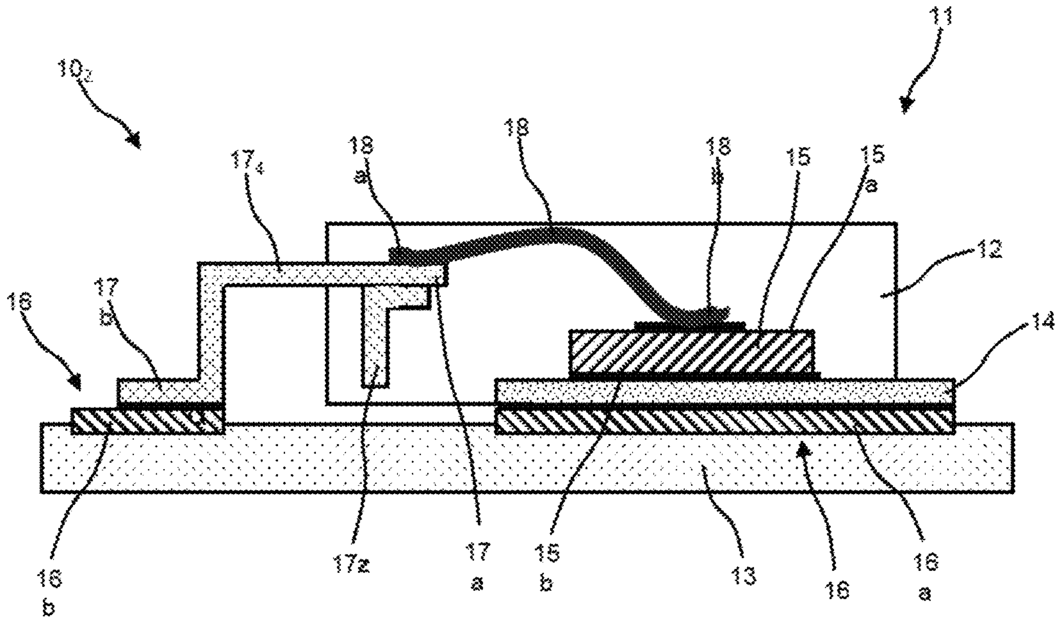

FIG. 3*c* shows the perpendicular example (α=90°) of the shielding plate 17*z* relative to the bond element $\mathbf{17}_4$. In this particular example, the shielding plate 17*z* is soldered to the bond element $\mathbf{17}_4$.

Figure 4A:
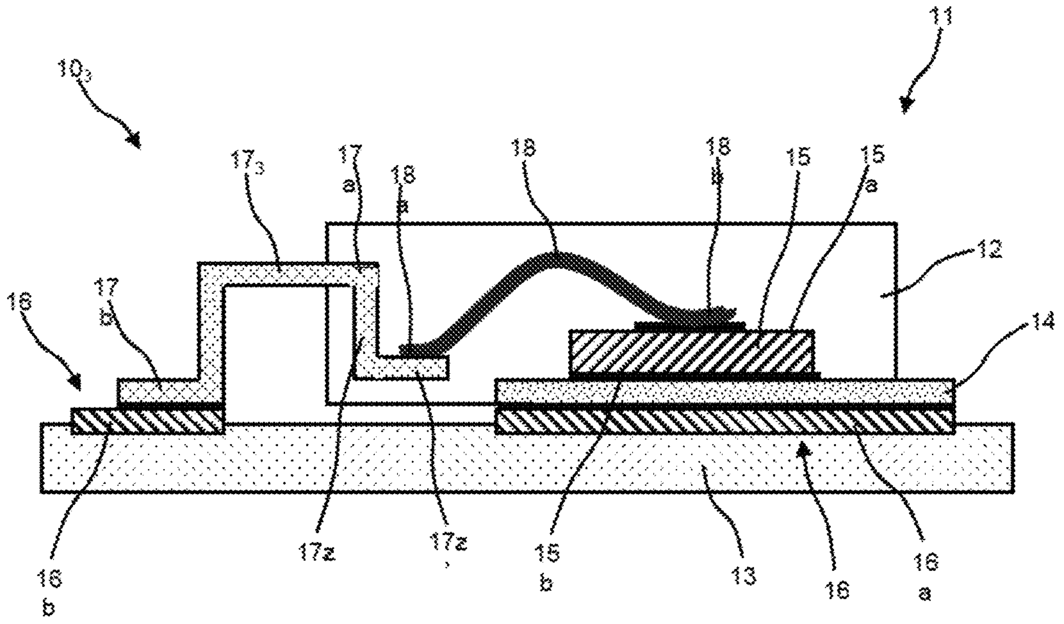
FIGS. 4*a*, 4*b* and 5 are fifth and six examples of a semiconductor package assembly according to the disclosure.
Figure 4B:
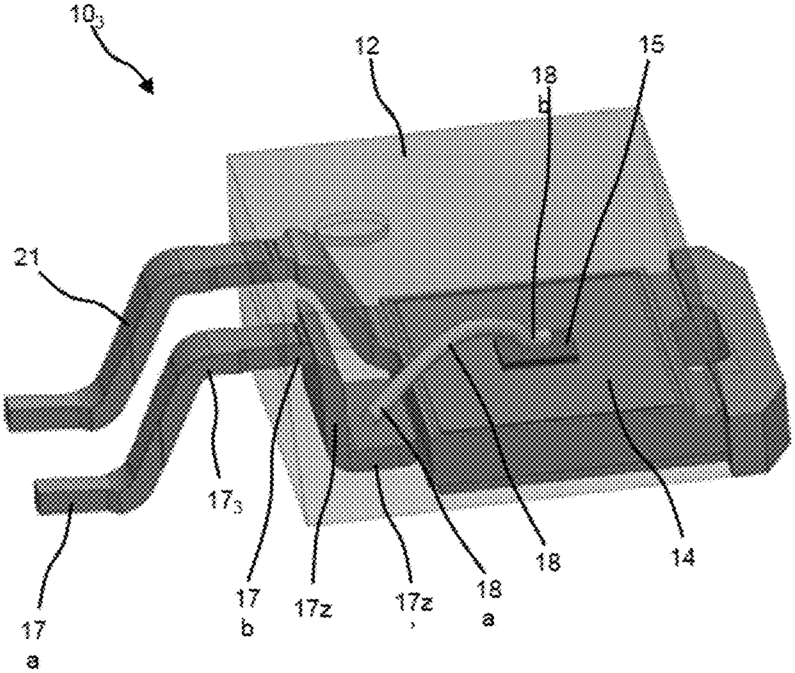
Figure 5:
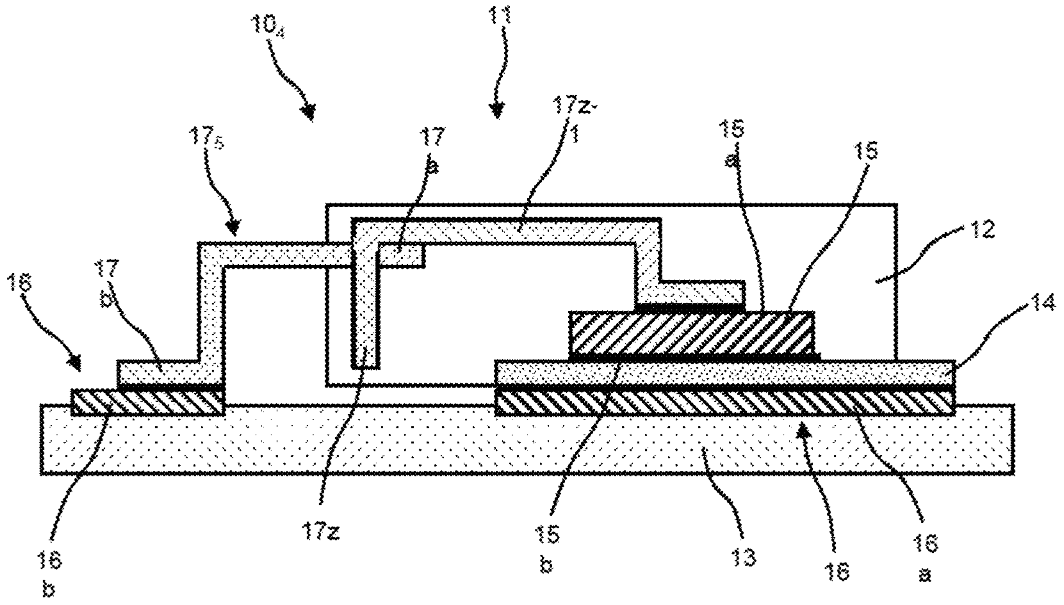

In the semiconductor package assembly example $\mathbf{10}_3$ of FIGS. 4*a* and 4*b*, the free end 17*z*' of the shielding plate 17*z* is bend in a direction towards the semiconductor die structure 15 and the lead frame 14. In particular, the shielding plate 17*z* of FIG. 4*a* has an angle α of 90° relative to the first, encapsulated element part 17*a* of the bond element $17_3$ whereas the free end 17*z*' of the shielding plate 17*z* is bend in a more or less 90° angle relative to the shielding plate 17*z* (and more or less parallel to the plane formed by the lead frame 14/the semiconductor die structure 15). In FIG. 4*b*, reference numeral 21 denotes a further bond element (clip), which is connected with the lead frame 14.

All configurations of the shielding plate 17*z* disclosed in this application, pushes the voltage potential present at the at least one bond element 17 towards the edge of the semiconductor package 11 and prevent reliability failures due to arcing (clearance distance) or tracking (creepage distance). The free bend end 17*z*' of the shielding plate 17*z* further alters the electric field lines between the first and the further conductive connection of the semiconductor package assembly $10_3$ of FIGS. 4*a*-4*b* thus providing a further prevention.

In the semiconductor package assemblies $10_2$ and $10_3$ of FIGS. 3*a*-3*c* and 4 a bond wire 18 is used within the molding resin case 12 for establishing the first conductive connection between the bond element 17 ($17_2$-$17_3$) and the first die side 15*a* of the semiconductor die structure 15. In particular the bond wire 18 is connected with its first wire end 18*a* with the encapsulated element part 17*a* of the bond element 17 and with its other wire end 18*b* with the first die side 15*a* of the semiconductor die structure 15, see FIGS. 3*a*-3*c*.

In the example of FIGS. 4*a* and 4*b*, the first wire end 18*a* is connected with the encapsulated free bend end 17*z*' of the shielding plate 17*z* and with its other wire end 18*b* with the first die side 15*a* of the semiconductor die structure 15. In all example the bond wire 18 is fully encapsulated by the molding resin case 12, guaranteeing a stable conductive connection.

Alternatively, in the examples of FIGS. 3*a*-3*c* and 4*a*-4*b*, the bond wire 18 can be replaced with an additional bond clip, which establishes in a likewise manner the first conductive connection within the encapsulated molding resin case 12 between the first die side 15*a* of the semiconductor die structure 15 and the encapsulated element part 17*a* of the bond element 17 or with the encapsulated free bend end 17*z*' of the shielding plate 17*z*. In the semiconductor package assembly $10_4$ of FIG. 5, the bond element $17_5$ is composed as a bond clip mounted with its exposed other element part 17*b* to the solder pad 16*b*. Its encapsulated first element part 17*a* is provided with the shielding plate 17*z*, which in turn has a bond clip 17*z*-1 incorporated therein, which is mounted or electrically connected to the first die side 15*a* of the semiconductor die structure 15.

In the semiconductor package assembly $10_1$ of FIGS. 2*a*-2*b* the bond element $17_1$ itself established the first conductive connection within the encapsulated molding resin case 12 with the semiconductor die structure 15. In this example, the bond element $17_1$ is composed as a bond clip mounted with its encapsulated first element part 17*a* to the first die side 15*a* of the semiconductor die structure 15 and mounted with its exposed other element part 17*b* to the solder pad 16*b*.

The first conductive connection within the encapsulated molding resin case can be established in an alternative fashion, as the first part of the at least one bond element can be provided with a bond clip or a bond wire, which is connected with the first die side of the semiconductor die structure.

LIST OF REFERENCE NUMERALS USED

10 semiconductor package assembly (state of the art)
$10_1$-$10_5$ semiconductor package assembly (examples of the disclosure)
11 semiconductor package
12 molding resin case
13 Printed Circuit Board (PCB)
14 lead frame
14*a* first side of lead frame
14*b* second side of lead frame
15 semiconductor die structure
15*a* first die side of semiconductor die structure
15*b* second die side of semiconductor die structure
16 PCB solder pad
16*a* PCB solder pad for heat sink of package 11
16*b* PCB solder pad for at least one lead of package 11
17 bond element (state of the art)
$17_1$-$17_5$ bond element (examples of the disclosure)
17*a* first element part of bond element
17*b* other element part of bond element
17*z* electric field modulation structures/shielding plate
α/α' angle between first part of bond element and shielding plate
17*z*' free end of shielding plate
17*z*-1 a bond clip incorporated in shielding plate
18 bond wire
18*a* first wire end of bond wire
18*b* other wire end of bond wire

What is claimed is:

1. A semiconductor package assembly consisting of a semiconductor package and a molding resin case, the semiconductor package comprising:

a lead frame having a first lead frame side and a second lead frame side opposite to the first lead frame side;

a semiconductor die structure having a first die side and a second die side opposite to the first die side, wherein the semiconductor die structure is mounted with its second die side on the first lead frame side of the lead frame, resulting in a first conductive connection;

at least one bond element being connected to the first die side of the semiconductor die structure, resulting in at least a one further conductive connection;

wherein the molding resin case encapsulates at least the semiconductor die structure, and wherein the lead frame and a first element part of the at least one bond element connected to the semiconductor die structure, leaves at least the second lead frame side of the lead frame and the other element part of the at least one bond element partly exposed;

wherein the at least one bond element is provided with electric field modulation structures structured to alter an electric field created between the first conductive connection and the at least further conductive connection during operation of the semiconductor package assembly, wherein the electric field modulation structures are formed as a shielding plate mounted to the first element part of the at least one bond element, and the shielding plate extends from the first element part of the at least one bond element towards the lead frame, and wherein the shielding plate is encapsulated by the molding resin case.

2. The semiconductor package assembly according to claim 1, wherein the electric field modulation structures are structured to limit or reduce the electric field outside the molding resin case.

3. The semiconductor package assembly according to claim 1, wherein the shielding plate extends at an angle from the first element part of the at least one bond element towards either the exposed other element part of the bond element or towards the semiconductor die structure.

4. The semiconductor package assembly according to claim 1, wherein the shielding plate has a free end that is bent in a direction towards the semiconductor die structure.

5. The semiconductor package assembly according to claim 1, wherein the at least one bond element is a bond clip mounted to the first die side of the semiconductor die structure.

6. The semiconductor package assembly according to claim 1, wherein the first part of the at least one bond element is provided with a bond clip or a bond wire connected with the first die side of the semiconductor die structure.

7. The semiconductor package assembly according to claim 1, wherein, when mounted to a printed circuit board, the shielding plate extends toward the printed circuit board.

8. The semiconductor package assembly according to claim 2, wherein the shielding plate extends at an angle from the first element part of the at least one bond element towards either the exposed other element part of the bond element or towards the semiconductor die structure.

9. The semiconductor package assembly according to claim 2, wherein the shielding plate has a free end that is bent in a direction towards the semiconductor die structure.

10. The semiconductor package assembly according to claim 2, wherein the at least one bond element is a bond clip mounted to the first die side of the semiconductor die structure.

11. The semiconductor package assembly according to claim 2, wherein the first part of the at least one bond element is provided with a bond clip or a bond wire connected with the first die side of the semiconductor die structure.

12. The semiconductor package assembly according to claim 3, wherein the angle is between 45°-90°.

13. The semiconductor package assembly according to claim 5, wherein the shielding plate has a free end that is bent and is provided with a bond clip or a bond wire connected with the first die side of the semiconductor die structure.

14. The semiconductor package assembly according to claim 8, wherein the angle is between 45°-90°.

15. The semiconductor package assembly according to claim 10, wherein the shielding plate has a free end that is bent and is provided with a bond clip or a bond wire connected with the first die side of the semiconductor die structure.

* * * * *